United States Patent
Stemmle et al.

(10) Patent No.: US 9,418,777 B2
(45) Date of Patent: Aug. 16, 2016

(54) METHOD OF ELECTRICALLY CONDUCTIVELY CONNECTING TWO SUPERCONDUCTIVE CABLES

(71) Applicant: NEXANS, Paris (FR)

(72) Inventors: Mark Stemmle, Hannover (DE); Frank Schmidt, Langenhagen (DE)

(73) Assignee: NEXANS, Paris (FR)

(*) Notice: Subject to any disclaimer, the term of this patent is extended or adjusted under 35 U.S.C. 154(b) by 203 days.

(21) Appl. No.: 14/339,591

(22) Filed: Jul. 24, 2014

(65) Prior Publication Data
US 2015/0031547 A1 Jan. 29, 2015

(30) Foreign Application Priority Data
Jul. 25, 2013 (EP) .................................... 13306075

(51) Int. Cl.
| | |
|---|---|
| *H01B 12/00* | (2006.01) |
| *H01B 12/16* | (2006.01) |
| *H01R 4/68* | (2006.01) |
| *H02G 15/34* | (2006.01) |
| *H01B 12/02* | (2006.01) |
| *H01B 13/00* | (2006.01) |
| *H05K 9/00* | (2006.01) |
| *H01B 12/06* | (2006.01) |
| *H02G 15/08* | (2006.01) |

(52) U.S. Cl.
CPC ............... *H01B 12/16* (2013.01); *H01B 12/02* (2013.01); *H01B 13/0036* (2013.01); *H01R 4/68* (2013.01); *H02G 15/34* (2013.01); *H05K 9/0098* (2013.01); *H01B 12/06* (2013.01); *H02G 15/085* (2013.01); *Y02E 40/648* (2013.01); *Y10T 29/49014* (2015.01)

(58) Field of Classification Search
CPC ............................ H01B 12/06; H01B 13/0036
USPC .................................................. 505/925, 926
See application file for complete search history.

(56) References Cited

U.S. PATENT DOCUMENTS

2004/0256126 A1* 12/2004 Ashibe ..................... H01R 4/68
174/15.5

FOREIGN PATENT DOCUMENTS

WO  2004013868  2/2004

* cited by examiner

*Primary Examiner* — Paul Wartalowicz
(74) *Attorney, Agent, or Firm* — Sofer & Haroun, LLP

(57) ABSTRACT

A method is disclosed for electrically conductively connecting two superconductive cables. The ends of the two cables are arranged next to each other and parallel to one another, in such a way that their free ends point in the opposite direction, and their conductors are located at least approximately on the same level next to each other. Two conductors of the two cables are electrically conductively connected to each other through electrical contact elements (10, 11, 12). The screens (6) of the two cables (1, 2) are connected through by separate contact elements (13, 14, 15) and the two cable ends are treated in this manner for constructing a transmission length for electrical energy are arranged jointly in a housing (16) of a cryostat so that during operation of the transmission length, a flowable cooling agent with electrically insulating properties flows through a housing (16) of a cryostat.

3 Claims, 1 Drawing Sheet

METHOD OF ELECTRICALLY CONDUCTIVELY CONNECTING TWO SUPERCONDUCTIVE CABLES

RELATED APPLICATION

This application claims the benefit of priority from European Patent Application No. 13 306 075.6, filed on Jul. 25, 2013, the entirety of which is incorporated by reference.

BACKGROUND

1. Field of the Invention

The invention relates to a method of electrically conductively connecting two superconductive cables, which each comprise at least two concentrically arranged conductors surrounded by a dielectric, and an electrically effective screen mounted above the outer dielectric, by means of which the conductors and screens to be connected are initially freed of surrounding layers and subsequently electrically conductively connected to each other (EP 1 552 536 B1).

2. Description of Related Art

Superconductive cables have been known for a long time in different embodiments. This is basically also applicable to technologies for electrically connecting two superconductive cables. A significant difference of the superconductive cables relative to the conventional cables resides in the fact that the cables have electrical, conductors of a material which at sufficiently low temperatures chances over into the superconductive state, with a direct current resistance which approaches zero. Suitable superconductive materials are, for example, oxidic materials on the basis of rare earths. Sufficiently low temperatures for placing such a material into the superconductive state are, for example, between 67K and 110K. Suitable cooling agents for all these materials are, for example, nitrogen, helium, neon and hydrogen, or mixtures of these materials. When operating a transmission length for electrical energy with at least one superconductive cable, the cable is arranged in accordance with known technology in a cryostat which consists of at least one thermally insulated pipe, through which, when operating the transmission length, a cooling agent suitable for a superconductive material used is conducted, advantageously one of the cooling agents mentioned above.

In transmission lengths of electrical energy two or more lengths of a superconductive cable must be connected to each other electrically conductively. This means that the conductors and the screens of the two cables are initially freed of surrounding layers. After the electrically conductive connection of two conductors of the two cables, the removed layers, i.e. essentially the dielectrics, must be reapplied. This is achieved, for example, essentially by winding bands of insulation material onto the entire connecting point including the two conductors. Subsequently, the conductors located thereabove and the screens can also be electrically conductively connected and can be insulated in the same manner. This is already very complicated and time consuming in the case of only one conductor and a screen, and it also requires the use of technically skilled personnel. In the case of a cable with two or three conductors which are arranged concentrically to each other and are insulated relative to each other, as disclosed for example in the above mentioned. EP 1 552 536 B1, the applied labor is extremely high, especially since it must be safely ensured that the wall thickness of the reconstructed insulation or insulations may not be significantly greater than the original wail thickness. It is only then that the dimensions of a cryostat are kept so small that they do not impair the operation of the transmission length, particularly the flow of the cooling agent through the cryostat.

OBJECTS AND SUMMARY

It is the object of the invention to modify the above described method in such a way that two superconductive cables with at least two concentrically arranged conductors can be connected electrically conductively with each other with significantly less effort.

In accordance with the invention, this object is met in that
  the ends of the two cables are arranged next to each other and parallel to each other in such a way that the free ends of the cables point in opposite directions and their conductors are at least approximately located on the same level next to one another,
  the ends of the two cables are secured relative to each other,
  two conductors each of the two cables are electrically conductively connected to each other by electrical contact elements extending transversely of their axial direction,
  the screens of the two cables are electrically conductively connected by means of two separate contact elements, and
  the two cable ends treated in this manner are arranged, when constructing a transmission length for the electrical energy, jointly in a housing of a cryostat such that during operation of the transmission length a flowable cooling agent with electrically insulating properties flows through the housing.

In the following, for simplicity's sake, instead of the words "superconductive conductor," the word conductor is used.

The essential advantage of this method resides in that after the electrically conductive connection of the conductors and of the screens independent of their number, it is not necessary to apply insulating layers onto the connecting points of the respective conductor. This significantly reduces the necessary work required for connecting the two cables. This is true for the reduction of insulating material used, as well as, for the time consuming activity of a person.

This advantage becomes particularly important in the case that the cables to be connected have three concentrically arranged conductors. In conventional technology, after the electrically conductive connection of the two conductors of the two cables has been completed, first the insulating layer or dielectric for these conductors must be restored before the two conductors located thereabove can be connected through.

It is also important for the method and the corresponding arrangement that the ends of the two cables extending parallel to each other are mechanically secured relative to each other so that the electrical contact elements extending transversely in their axial direction can be mounted on the respective conductors and, upon a movement of the cable ends, cannot be damaged.

Since the two superconductive cables point with their ends in opposite directions, in a cable having two concentrically arranged conductors, the respectively inner conductor of the one cable is located next to the outer conductor of the other cable. Therefore, an inner and an outer conductor respectively is electrically conductively connected. Consequently, the impedance of the individual conductors is rendered uniform, with correspondingly improved transmission behavior of the entire cable's length. This is particularly advantageous in transmission lengths with more than two cable sections connected in accordance with this method. This advantage is also applicable to superconductive cables with three concentrically arranged conductors because the respectively inner conductor is electrically conductively connected to the outer conductor of the respective other cable. The respectively middle conductors of both cables are always connected to each other.

The method can basically be carried out outside of a cryostat. However, it is also particularly advantageous if the two cables are already arranged in a cryostat surrounding the cables and, after exposing the conductors and the screens, are inserted into a housing constructed as a cryostat. In this connection, the cables can initially be mechanically secured in the housing before the contact elements are mounted.

BRIEF DESCRIPTION OF THE DRAWINGS

The method according to the invention and an arrangement manufactured by the method are explained as embodiments with the aid of the drawings.

In the drawing.

DETAILED DESCRIPTION

Figure 1:
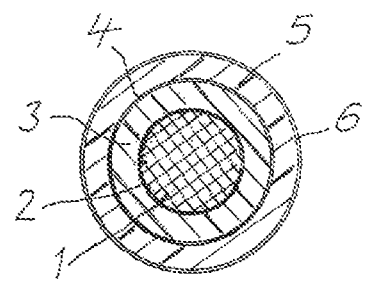
FIG. 1 is a sectional view of a superconductive cable with two concentrically arranged conductors.
Figure 2:
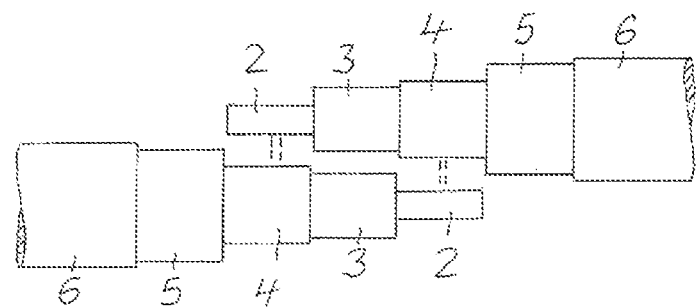
FIG. 2 shows the oppositely directed ends of two cables according to FIG. 1 with layers of its construction shown in a step-wise manner.

The method according to the invention is to be used for a simple electrically conductive connection of two superconductive cables which have at least two concentrically arranged conductors. A corresponding cable will be explained with the aid of FIGS. 1 and 2. An arrangement with two superconductive cables which have three concentrically arranged conductors is shown in FIG. 3.

Figure 3:
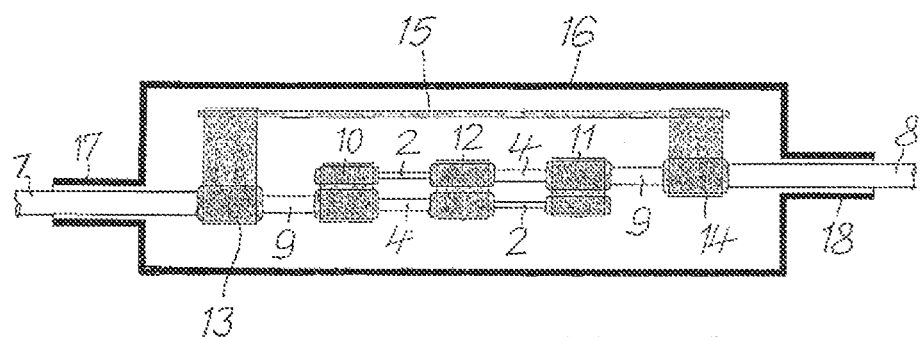
FIG. 3 schematically shows a connecting point of two cables with three concentrically arranged superconductive conductors.

In FIG. 3, the ends of two superconductive cables 7 and 8 are schematically illustrated which have, in addition to the conductors 2 and 4, a third conductor 9 which is arranged concentrically relative to the two conductors 2 and 4 and above the dielectric 5, and which is also surrounded by a dielectric, not shown, and above which the screen 6 is located. The ends of the two cables 7 and 8 point in opposite directions. They extend parallel to each other and are mechanically secured relative to each other. Their conductors 2, 4 and 9 are situated at least approximately on the same level.

In the position illustrated in FIG. 3, the conductors 2 of the two cables 7 and 8 are connected to the conductors of the respective other cable by means of contact elements 10 and 11 which extend transversely of the axial direction of the two cables 7 and 8.

Contact elements 13 and 14 are mounted on the two screens 6 of the two cables 7 and 8 which are electrically conductively connected to each other through a connection element 15 independently of the contact elements 10, 11 and 12 and are connected electrically conductively with each other.

The cable ends secured mechanically and electrically connected to each other can be introduced into a housing 16 constructed as a cryostat. During operation of the transmission length, the cooling agent used, for example, liquid nitrogen, flows also through the housing 16. The cooling agent is simultaneously the insulating medium for the two cables 7 and 8, or their conductors 2, 4, and 9, as well as of the screens 6, so that as already mentioned, the mounting of insulating material is not necessary.

In accordance with a preferred embodiment, the cables 7 and 8 are each initially arranged in a cryostat from which they protrude to such an extent that their conductors and screens are exposed in the described manner. The ends of corresponding cryostats 17 and 18 are shown in FIG. 3. They are connected to the housing 16 constructed as a cryostat. When inserting the ends of the two cables 7 and 8 into the housing 16, they can also be connected mechanically relative to each other through holding elements provided in the housing.

The electrical contact elements 10, 11 and 12, as well as 14, can be mounted with connecting element 15 within the housing 16. The housing 16 constructed correspondingly is then initially still open. It is subsequently locked.

The invention claimed is:

1. Method for electrically conductively connecting two superconductive cables which are each arranged concentrically relative to each other and are each surrounded by a dielectric, and have an electrically effective screen mounted above the outer dielectric by means of which the conductors and screens to be connected are initially freed of surrounding layers at the ends of the two cables and are subsequently electrically conductively connected to each other, said method comprising the steps of:

the ends of the two cables are arranged next to each other and parallel to one another such that their free ends point in opposite directions and their conductors are located at least approximately on the same level;

the ends of the two cables are secured relative to each other;

two conductors of the two cables are always connected to each other electrically conductively through electrical contact elements;

the screens of the two cables are electrically conductively connected through by means of separate contact elements; and the two cable ends treated in this manner are arranged in a housing of a cryostat for constructing a transmission length for electrical energy jointly in a housing of a cryostat which, during operation of the transmission length, a flowable cooling agent with electrically insulating properties flows through a housing of a cryostat.

2. Method according to claim 1, wherein each of the two cables is initially mounted in a cryostat connected to the housing in such a way that the respective cable ends protrude out of the corresponding cryostat and in the housing, the two cable ends are mechanically connected to one another in the still open housing, the contact elements are mounted on the exposed conductors and screens of the two cables, the contact elements are mounted within the housing on the exposed conductors and screens of the two cables, a conductive connection is effected between the screens of the two cables, and the housing is subsequently locked.

3. Arrangement manufactured with the method according to claim 2, wherein in a housing constructed as a cryostat, the ends of two superconductive cables are arranged whose conductors and screens (6) are at these ends freed of surrounding layers, the conductors of the two cables are connected to each other electrically conductively by means of electrical contact elements which extend transversely of their axial direction, and that the screens of the two cables are electrically conductively connected through by means of separate contact elements.

* * * * *